(12) United States Patent
Ranish et al.

(10) Patent No.: US 10,256,005 B2
(45) Date of Patent: Apr. 9, 2019

(54) ROTATING SUBSTRATE LASER ANNEAL (71) Applicant: Applied Materials, Inc., Santa Clara, CA (US)

(72) Inventors: Joseph M. Ranish, San Jose, CA (US); Shashank Sharma, Fremont, CA (US); Diwakar N. Kedlaya, San Jose, CA (US); Aaron Muir Hunter, Santa Cruz, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 384 days.

(21) Appl. No.: 15/213,844

(22) Filed: Jul. 19, 2016

(65) Prior Publication Data

US 2017/0032865 A1 Feb. 2, 2017

Related U.S. Application Data

(60) Provisional application No. 62/198,556, filed on Jul. 29, 2015.

(51) Int. Cl.
*G21K 5/10* (2006.01)
*B23K 26/12* (2014.01)
*H01L 21/67* (2006.01)

(52) U.S. Cl.
CPC .......... *G21K 5/10* (2013.01); *H01L 21/67115* (2013.01)

(58) Field of Classification Search
CPC ................................ G21K 5/10; B23K 26/127
USPC ......................................... 219/121.6, 121.86
See application file for complete search history.

(56) References Cited

U.S. PATENT DOCUMENTS

| 4,666,678 | A | * | 5/1987 | Lemelson | B21D 26/06 |
| | | | | | 204/157.61 |
| 5,468,930 | A | * | 11/1995 | Nishikawa | C23C 14/28 |
| | | | | | 219/121.6 |
| 6,717,158 | B1 | | 4/2004 | Gat et al. | |
| 8,536,492 | B2 | | 9/2013 | Ramamurthy et al. | |
| 8,624,165 | B2 | | 1/2014 | Kusuda et al. | |
| 2002/0020696 | A1 | | 2/2002 | Kitamura et al. | |
| 2003/0236642 | A1 | | 12/2003 | Timans | |

(Continued)

FOREIGN PATENT DOCUMENTS

KR     1020050028081      3/2005

OTHER PUBLICATIONS

International Search Report and Written Opinion for International Application No. PCT/US2016/042954 dated Oct. 25, 2016.

*Primary Examiner* — Samuel M Heinrich
(74) *Attorney, Agent, or Firm* — Patterson + Sheridan LLP (57) ABSTRACT

Embodiments of the present disclosure relate to thermal processing of substrates. More specifically, embodiments described herein relate to flash on spike annealing processes and apparatus suitable for performing such processes. In one embodiment, a thermal processing apparatus may include a lamp radiation source, a laser source, and a reflector plate disposed between the lamp radiation source and the laser source. One or more apertures may be formed in the reflector plate and the laser source may be positioned adjacent to the reflector plate such that a laser beam emitted from the laser source propagates through the one or more apertures. In one embodiment, the reflector plate may be substantially circular and the one or more apertures may approximate a sector of the reflector plate.

20 Claims, 7 Drawing Sheets

(56) References Cited

U.S. PATENT DOCUMENTS

| | | |
|---|---|---|
| 2006/0018639 A1 | 1/2006 | Ramamurthy et al. |
| 2007/0119815 A1 | 5/2007 | Zhang et al. |
| 2011/0185969 A1 | 8/2011 | Yang |
| 2012/0067864 A1 | 3/2012 | Kusuda et al. |
| 2012/0236896 A1* | 9/2012 | Takida ............... B23K 26/0853 372/55 |
| 2013/0248504 A1 | 9/2013 | Kusuda |

* cited by examiner

ROTATING SUBSTRATE LASER ANNEAL

CROSS-REFERENCE TO RELATED APPLICATIONS

This application claims benefit of U.S. Provisional Patent Application No. 62/198,556, filed Jul. 29, 2015, the entirety of which is herein incorporated by reference.

BACKGROUND

Field

Embodiments of the present disclosure generally relate to apparatus for thermally processing a substrate. More specifically, embodiments described herein relate to apparatus for a rotating substrate laser anneal.

Description of the Related Art

Integrated circuits have evolved into complex devices that can include millions of transistors, capacitors, and resistors on a single chip. The evolution of chip design continually requires faster circuitry and greater circuit density that demand increasingly precise fabrication processes. One such fabrication process frequently utilized is ion implantation processes.

While various other integrated circuit fabrication processes are frequently utilized, ion implantation is particularly important in forming transistor structures on semiconductor substrate and may be repeated many times during chip fabrication. During ion implantation, a semiconductor substrate is bombarded by a beam of electrically charged ions, commonly referred to as dopants. Ion implantation changes the properties of the materials in which the dopants are implanted in order to achieve a particular level of device performance.

During ion implantation, implanted films may develop a high level of internal stress. In order to relieve the stress by repairing the crystal matrix of an implanted film and to further control the resulting properties of the implanted film, the film is typically subjected to a thermal process, such as annealing. Annealing is typically performed in a rapid thermal processing (RTP) chamber that subjects the substrate to a very brief, yet highly controlled thermal cycle to align dopants within the crystal matrix of the implanted film. However, the movement of dopant atoms within the implanted film may exceed a desired zone of occupation for the dopants if too much heat is applied, or if heat is applied for too long a time.

As devices become smaller, the target dopant zone also becomes smaller, making the task of aligning dopants in the crystal matrix while preventing undesirable diffusion beyond the target zone increasingly difficult. Nanosecond anneals utilizing megawatt lasers may be suitable in certain instances, but such tools are often very large and too expensive to implement cost-effectively.

Figure 1:
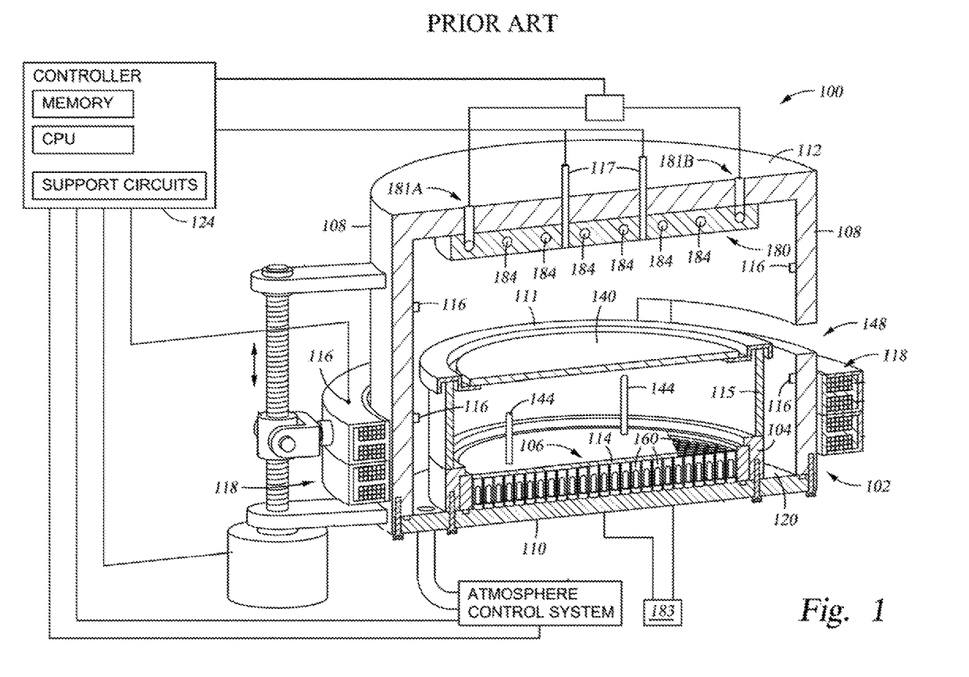
FIG. 1 illustrates a simplified isometric view of a prior art RTP chamber according to embodiments described herein.

FIG. 1 illustrates a simplified isometric view of a prior art RTP chamber. A processing chamber 100 includes a contactless or magnetically levitated substrate support 104, a chamber body 102, having walls 108, a bottom 110, and a top 112 defining an interior volume 120. The walls 108 typically include at least one substrate access port 148 to facilitate entry and egress of a substrate 140 (a portion of which is shown in FIG. 1). The access port may be coupled to a transfer chamber (not shown) or a load lock chamber (not shown) and may be selectively sealed with a valve, such as a slit valve (not shown). The substrate support 104 may be annular. The chamber 100 includes a radiant heat source 106 disposed in an inside diameter of the substrate support 104.

The substrate support 104 is adapted to magnetically levitate and rotate within the interior volume 120, so that the substrate support 104 is capable of rotating while raising and lowering vertically during processing. A window 114 made from a material transparent to heat and light of various wavelengths may be used to shield the radiant heat source 106 from the processing environment while allowing the radiant heat source 106 to heat the substrate 140. The window 114 may include a plurality of lift pins 144 coupled through an upper surface of the window 114.

The radiant heat source 106 may be a lamp assembly formed from a housing which includes a plurality of honeycomb tubes 160 coupled to a coolant source 183. The housing may be made of a copper material or other suitable material having suitable coolant channels formed therein for flow of the coolant from the coolant source 183.

The chamber 100 may also include one or more sensors 116, which are generally adapted to detect the elevation of the substrate support 104 (or substrate 140) within the interior volume 120 of the chamber body 102. The sensors 116 may be coupled to the chamber body 102 and/or other portions of the processing chamber 100 and are adapted to provide an output indicative of the distance between the substrate support 104 and the top 112 and/or bottom 110 of the chamber body 102, and may also detect misalignment of the substrate support 104 and/or substrate 140.

The RTP chamber 100 may also include a cooling block 180 adjacent to, coupled to, or formed in the top 112. Generally, the cooling block 180 is spaced apart and opposing the radiant heat source 106. The cooling block 180 comprises one or more coolant channels 184 coupled to an inlet 181A and an outlet 181B. The cooling block 180 may include a reflector coupled to a surface of the cooling block 180 facing the substrate support 104.

The RTP chamber 100, using lamp heat sources, may have a time constant that is too large for some applications. Lamp heat sources, and the housing surrounding them, may heat or cool too slowly to perform effective annealing without significant dopant diffusion in some cases.

Thus, what is needed in the art are improved apparatus for rapid thermal processing.

SUMMARY

In one embodiment, an apparatus for processing a substrate is provided. The apparatus includes a chamber defining an interior volume and a radiant heat source may be disposed within the interior volume. A rotatable support may be disposed within the interior volume adjacent the radiant heat source. A laser source may be disposed within the interior volume adjacent the substrate support and a window may be disposed within the interior volume between the radiant heat source and the laser source.

In another embodiment, an apparatus for processing a substrate is provided. The apparatus includes a chamber defining an interior volume and a radiation source may be disposed within the interior volume. A rotatable substrate support may be disposed within the interior volume adjacent the radiation source and a laser source may be disposed within the interior volume adjacent the substrate support. A reflector plate may be disposed within the interior volume between the laser source and the substrate support and the reflector plate may have one or more apertures formed therein.

In yet another embodiment, an apparatus for processing a substrate is provided. The apparatus includes a chamber defining an interior volume and a lamp radiation source disposed within the interior volume. A rotatable substrate support may be disposed within the interior volume adjacent the lamp radiation source and a laser source may be disposed within the interior volume adjacent the substrate support. A window may be disposed within the interior volume between the lamp radiation source and the laser source and a circular reflector plate may be disposed within the interior volume between the laser source and the window. The circular reflector plate may have one or more sector shaped apertures formed therein.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to thermal processing of substrates. More specifically, embodiments described herein relate to flash on spike annealing processes and apparatus suitable for performing such processes. In one embodiment, a thermal processing apparatus may include a lamp radiation source, a laser source, and a reflector plate disposed between the lamp radiation source and the laser source. One or more apertures may be formed in the reflector plate and the laser source may be positioned adjacent to the reflector plate such that a laser beam emitted from the laser source propagates through the one or more apertures. In one embodiment, the reflector plate may be substantially circular and the one or more apertures may approximate a sector of the reflector plate.

Figure 2:
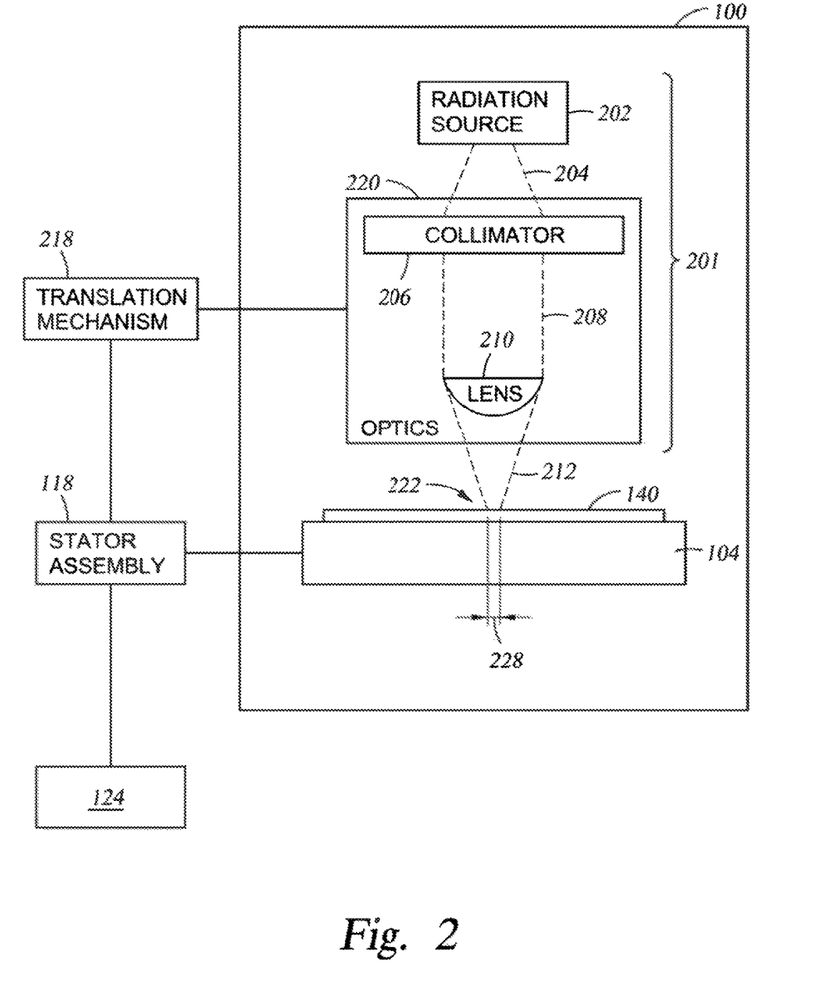
FIG. 2 illustrates a schematic view of a laser source according to embodiments described herein.

FIG. 2 illustrates a schematic view of the processing chamber 100 with an additional radiation module 201 added, according to embodiments described herein. The processing chamber 100 shown in FIG. 2 may also include the substrate support 104 and a translation mechanism 218. The substrate support 104 may include a heat source, such as a resistive heater or the like, to heat the substrate independently of a radiation source 202. The radiation module generally includes the radiation source 202 and focusing optics 220 disposed between the radiation source 202 and the substrate support 104.

The radiation source 202 may be a laser source capable of emitting continuous waves of electromagnetic radiation or pulsed emissions of electromagnetic radiation. In certain embodiments, a single radiation source 202 is utilized to generate a laser beam. In other embodiments, multiple radiation sources 202 are utilized to generate the laser beam. In one embodiment, the radiation source 202 comprises a plurality of fiber lasers. Alternatively, the radiation source 202 may be a non-laser radiation source, such as a flash lamp, a halogen lamp, a light emitting diode source, or the like. For example, a non-laser low incidence flux source may be a suitable example of the radiation source 202. Generally, the radiation source 202 is utilized to heat the substrate during an annealing or surface modification process. More specifically, the radiation source 202 is utilized to induce a temperature increase in the surface of the substrate more deeply throughout the entire thickness of the substrate. After exposure of the substrate to the radiation source 202, the substrate may be laterally conductively cooled by the bulk of the substrate. Alternatively or in combination, a substrate having a low thermal conductivity, such as less than about 3 W/m/L, may be suitable for surface thermal processing. However, it is contemplated that any combination of processing techniques and temperatures may be utilized to process the substrates in various different manners.

The radiation emitted from the radiation source 202 may be absorbed at or near the surface of the substrate 140. Accordingly, the radiation may be emitted from the radiation source 202 at a wavelength within the range at which the substrate 140 absorbs radiation. Generally, for a silicon containing substrate, the radiation wavelength may be between about 190 nm and about 950 nm, for example, about 810 nm. Alternatively, a high power UV laser may be utilized as the radiation source 202.

The radiation source 202 may be capable of emitting radiation continuously for an amount of time greater than about 1 second, such as greater than about 10 seconds, for example, greater than about 15 seconds. Alternatively, the radiation source 202 may be capable of emitting pulses of radiation for an amount of time greater than about 1 second, such as greater than about 10 seconds, for example, greater than about 15 seconds. The radiation source 202 may include multiple laser diodes, each of which produces uniform and spatially coherent light at substantially the same wavelength. The power of the laser diode(s) may be within the range of between about 0.5 kW and about 50 kW, for example about 5 kW.

The focusing optics 220 may include one or more collimators 206 to collimate radiation 204 from the radiation source 202 into a substantially parallel beam. The collimated radiation 208 may then be focused by at least one lens 210 into a line of radiation 212 at an upper surface 222 of the substrate 140. The term "line of radiation" as used herein is intended to be representative of the spatial distribution of the radiation 212 at the upper surface 222 of the substrate 140. It is contemplated the spatial distribution of the radiation 212 may be shaped like a line or ribbon, a sector, a spot or plurality of spots, and the like. Generally, the substrate 140 may be a circular substrate having a diameter of about 200 mm, about 300 mm, or about 450 mm. The line of radiation 212 may extend across the substrate 140 with a width 228 of between about 3 µm and about 500 µm. A length of the line of radiation 212 may approximate the radius of the substrate 140 in one embodiment and the diameter of the substrate 140 in another embodiment. For example, the length of the line of radiation 212 may be about 150 mm for a 300 mm diameter substrate. Alternatively, the length of the line of radiation 212 may be about 300 mm for a 300 mm diameter substrate.

Generally, the length of the line of radiation 212 may be greater than the width 228. In one embodiment, the line of radiation 212 may linearly traverse the substrate 140 such that the line of radiation 212 is substantially perpendicular to the direction of movement of the substrate 140, i.e. the line of radiation 212 remains parallel to a fixed line or chord of the substrate 140 that is perpendicular to the direction of substrate movement.

In one embodiment, the line of radiation 212 may be shaped like a "pie slice." For example, the line of radiation 212 may approximate a sector of the substrate 140 extending from the origin of the circular substrate 140 to an arc at the circumference of the substrate 140 defined by the sector angle of measure. In one embodiment, the sector angle of measure may be between about 0.005° and about 140°, for example, between about 0.01° and about 20°. In another embodiment, the line of radiation 212 may be shaped like a pie slice which approximates the diameter of the substrate 140. In another embodiment, the line of radiation 212 may be a Gaussian laser spot. In this embodiment, one or more Gaussian laser spots may be generated (i.e. by multiple radiation sources such as fiber lasers) in the shape of a ribbon (line) or in a pie slice shape.

The lens 210 may be any suitable lens, or series of lenses, suitable for forming the desired shape of the line of radiation 212. In one embodiment, the lens 210 may be a cylindrical lens. Alternatively, the lens 210 may be one or more concave lenses, convex lenses, plane mirrors, concave mirrors, convex mirrors, refractive lenses, diffractive lenses, Frensel lenses, gradient index lenses, or the like. Generally, the lens 210 may be configured to influence a radial or diametric power distribution of the line of radiation 212 from the origin to the circumference of the substrate 140.

The power distribution of the line of radiation 212 may be between about 10 kW/cm$^2$ and about 200 kW/cm$^2$. The power distribution of the line of radiation 212 at or near the origin of the substrate 140 may be about 0 kW/cm$^2$ for a line of radiation 212 approximating a radius of the substrate 140. The power distribution of the line of radiation 212 may increase from the origin to the circumference or edge of the substrate 140. The power distribution may increase from the origin to the edge linearly or exponentially in certain embodiments. Alternatively, an equal power distribution along the line of radiation 212 may be substantially constant. In this embodiment, the substrate's exposure to the radiation 212 may be modulated by the shape or spatial distribution of the radiation 212 at the upper surface 222 of the substrate 140. It is contemplated that the substrate 140 may be heated to temperatures up to about 1000° C. by the radiant heat source 106 and the radiation module 201 may be configured to heat the substrate 140 an additional 20° C. to about 250° C. The ramp-up and ramp-down rates of the radiation module heating may exceed about 4,000,000° C./sec.

Various examples of process conditions are provided with reference to Table 1 and Table 2. Table 1 illustrates various process conditions for 300 mm diameter substrates and Table 2 illustrates various process conditions for both 200 mm and 450 mm diameter substrates.

TABLE 1

Single Substrate

| Rotational speed (rpm) | Power duration per revolution (ms) | Exposure time (sec) | Exposure flux (W/m$^2$) | Sector angle (°) | Min. radius (mm) | Max. Radius (mm) | Exposure width at min. radius (mm) | Exposure width at max. radius (mm) |
|---|---|---|---|---|---|---|---|---|
| 240 | 250 | 0.01 | 1.0E7 | 14.4 | 3 | 150 | 0.7539 | 37.6991 |
| 240 | 250 | 0.001 | 1.0E7 | 1.44 | 3 | 150 | 0.0753 | 3.7699 |
| 240 | 250 | 0.001 | 1.0E8 | 1.44 | 3 | 150 | 0.0753 | 3.7699 |
| 240 | 250 | 0.0001 | 1.0E9 | .0144 | 3 | 150 | 0.0075 | 0.3769 |

TABLE 2

Multiple Substrate Carousel

| Rotational speed (rpm) | Power duration per revolution (ms) | Exposure time (sec) | Exposure flux (W/m$^2$) | Sector angle (°) | Min. radius (mm) | Max. Radius (mm) | Exposure width at min. radius (mm) | Exposure width at max. radius (mm) |
|---|---|---|---|---|---|---|---|---|
| 240 | 250 | 0.001 | 1.0E8 | 1.44 | 50 | 200 | 1.2566 | 5.0265 |
| 60 | 1000 | 0.001 | 1.0E8 | 0.36 | 50 | 200 | 0.3141 | 1.2566 |
| 240 | 250 | 0.0001 | 1.0E9 | 0.144 | 50 | 200 | 0.1256 | 0.5026 |
| 60 | 1000 | 0.0001 | 1.0E9 | 0.036 | 50 | 200 | 0.0314 | 0.1256 |
| 60 | 1000 | 0.01 | 1.0E7 | 3.6 | 150 | 450 | 9.4247 | 28.2743 |
| 60 | 1000 | 0.001 | 1.0E8 | 0.36 | 150 | 450 | 0.9424 | 2.8274 |
| 60 | 1000 | 0.0001 | 1.0E9 | 0.036 | 150 | 450 | 0.0942 | 0.2827 |

A stator assembly 118 may be configured to rotate the substrate 140 within the chamber 100. The stator assembly 118 generally rotates the substrate support 104 to impart a rotational velocity to the substrate 140 disposed thereon. In certain embodiments, the stator assembly 118 may be configured to rotate the substrate 140 at between about 10 revolutions per minute and about 500 revolutions per minute, such as between about 200 revolutions per minute and about 300 revolutions per minute, for example, between about 230 revolutions per minute and about 250 revolutions per minute.

A translation mechanism 218, such as a stepper motor, may be coupled to the radiation module 201 in one embodiment. In this embodiment, the translation mechanism 218 may be configured to move the radiation module 201, or various components thereof, relative to the upper surface 222 of the substrate 140. For example, the translation mechanism 218 may move the line of radiation 212 from the center of the substrate 140 towards the edge of the substrate 140. Alternatively, the translation mechanism 218 may move the line of radiation 212 from the edge of the substrate 140 towards the center of the substrate 140. In one embodiment, the translation mechanism 218 may be configured to raster the line of radiation 212. In this embodiment, the raster cycle may be performed at greater than about 1 Hz, such as greater than about 1 kHz. In addition, the translation mechanism 218 and the stator assembly 118 may be in electrical communication with each other and actions performed by either the translation mechanism 218 and/or the stator assembly 118 may be controlled by the controller 124.

Figure 3:
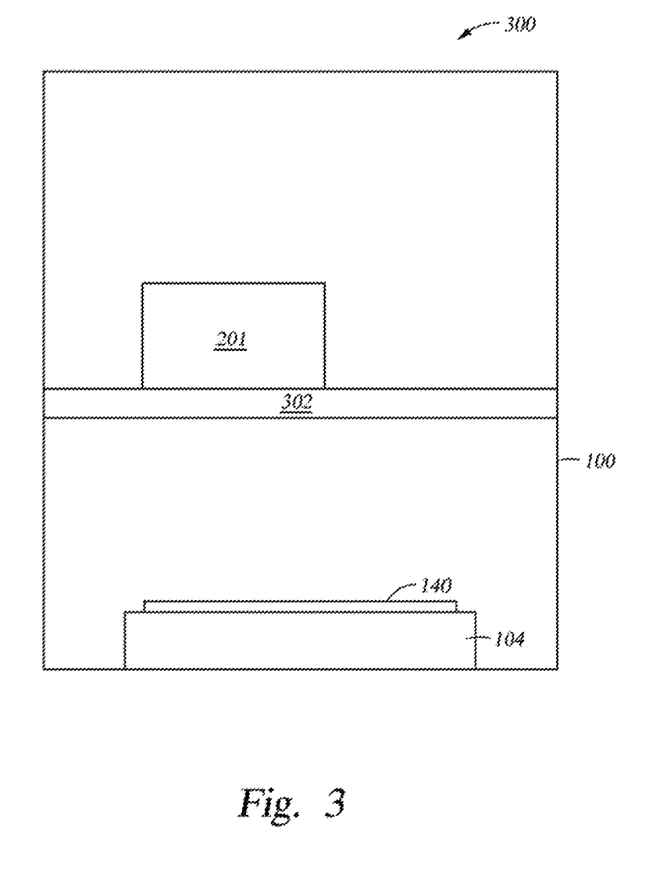
FIG. 3 illustrates a schematic view of an RTP chamber which includes multiple radiation modules according to embodiments described herein.

FIG. 3 illustrates a schematic view of an RTP chamber 300 which includes at least two radiation modules according to embodiments described herein. The chamber 300 may be the chamber 100 including the radiation module 201 and a reflector plate 302 disposed between the substrate support 104 and the radiation module 201. Generally, the radiant heat source 106 (not shown) is configured to heat the substrate 140 to a target temperature, such as greater than about 800° C., for example, about 1000° C., and subsequently perform a flash anneal on the heated substrate utilizing the radiation module 201. In one embodiment, the radiation module 201 is a laser source.

It is believed that the thermal conductivity of the heated substrate 140 is relatively low (when compared to a room temperature substrate, for example). As a result, the penetration of the flash anneal radiation into the surface of the substrate 140 is shallow and dissipates quickly due to cooling via conduction to the remainder of the substrate. Generally, a decrease in thermal diffusion is realized at high temperatures (i.e. about 1000° C. or higher), which may enable utilization of lower power radiation sources to perform flash anneals.

Figure 4A:
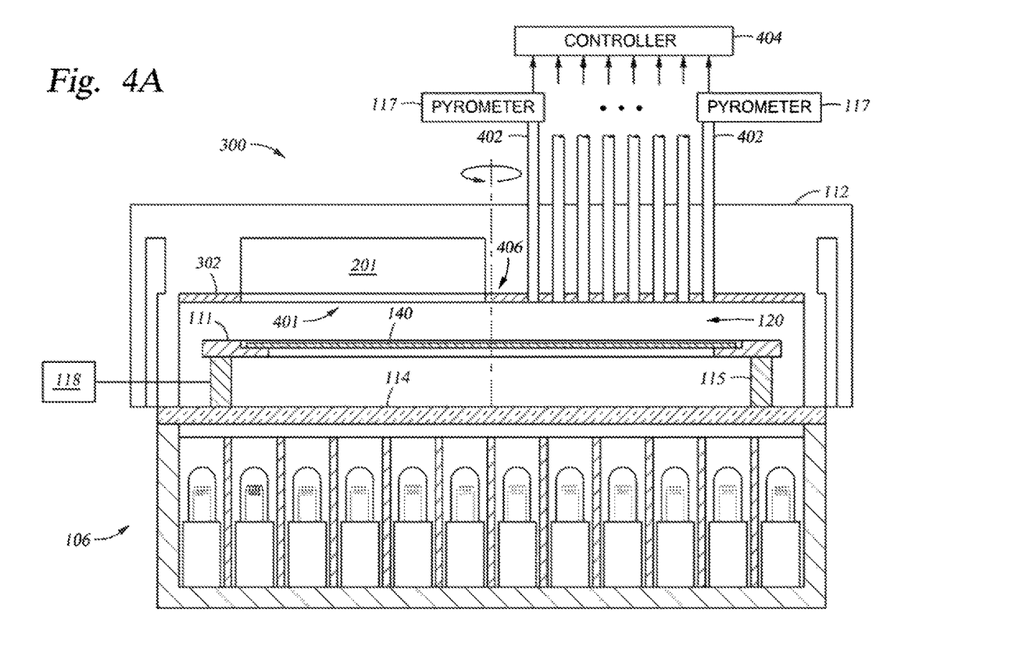
FIG. 4A illustrates a partial, cross-sectional view of an RTP chamber with a laser source according to embodiments described herein.

FIG. 4A illustrates a partial, cross-sectional view of the RTP chamber 300 with the radiation module 201 according to embodiments described herein. The chamber 300 includes the radiant heat source 106 coupled to the window 114. The substrate 140 is supported by the annular ring 111 which is disposed on the annular extension 115. The substrate may be positioned in the interior volume 120 between the window 114 and the reflector plate 302. When the substrate 140 is positioned for processing, the reflector plate 302 may be disposed a distance of between about 1 mm and about 10 mm from the substrate 140, for example, between about 3 mm and about 5 mm. The substrate support 104, which generally includes the annular extension 115 and the annular ring 111, is connected to the stator assembly 118 and may be configured to rotate about an axis of rotation, generally about the center or origin of a circular substrate.

The chamber 300 also includes the one or more temperature sensors 117, such as pyrometers, which are coupled to one or more light transmission elements s. The light transmission elements 402, such as light pipes or the like, may be optically coupled to the reflector plate 302 or may physically extend through the reflector plate 302. Electromagnetic radiation sensed by the temperature sensors 117 may be converted to a temperature measurement and a controller 404, which may be in communication with the controller 124, may be configured to provide real time temperature feedback. The temperature feedback may be utilized to correct for temperature non-uniformities during thermal processing.

The reflector plate 302 may be coupled to the chamber top 112 or other chamber components and the shape and size of the reflector plate 302 may approximate that of the substrate 140. For example, the reflector plate 302 may be a substantially circular shape having a diameter similar to that of the substrate 140. It is contemplated however, that the size and shape of the reflector plate 302 may differ from that of the substrate 140, depending on certain rapid thermal processing variables. The reflector plate may be formed from materials suitable to withstand temperatures common in rapid thermal annealing processes. For example, the reflector plate may be a quartz material or other similar material. The reflector plate 302 may also have an embedded filter element or may have a filter coated on a surface of the reflector plate 302 to improve temperature measurement by the temperature sensors 117.

The reflector plate 302 may also have an aperture 401 formed therein. The aperture 401 may be various shapes, depending on the desired embodiment, and multiple apertures may also be formed or defined by the reflector plate 302. In the illustrated embodiment, the aperture 401 may extend radially outward from about the center 406 of the reflector plate 302. The illustrated embodiment depicts that the aperture 401 does not extend to the circumferential edge of the reflector plate 302, rather, that the aperture 401 is fully enclosed and defined by the reflector plate 302.

Figure 4B:
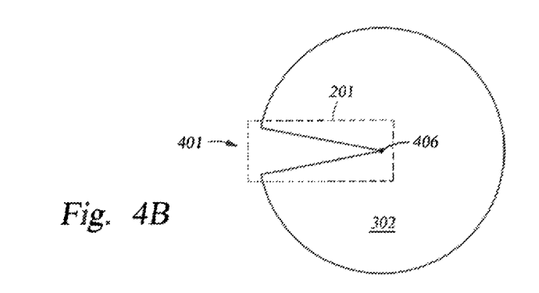
FIG. 4B illustrates a partial, plan view of the laser source and reflector plate according to embodiments described herein.

The radiation module 201 of FIG. 4A is coupled to the reflector plate 302 in registration with the aperture 401. In another embodiment illustrated in FIG. 4B which depicts a schematic, partial plan view of the radiation module 201 and the reflector plate 302, the aperture 401 may extend along substantially the entire radius of the reflector plate 302 from the center 406 to the edge of the reflector plate. In this embodiment, the circumference of the reflector plate 302 may be non-continuous as the aperture 401 may be representative of a sector.

FIGS. 5A-5E illustrate schematic, plan views of various reflector plates according to various embodiments described herein. Generally the reflector plates described below may be utilized in a rapid thermal processing system utilizing a radiant heat source and a laser source with substrate rotation capability. The reflector plate apertures may be configured to compensate for the dwell time and power of laser radiation exposed to a substrate through the apertures. In certain embodiments, a progressive aperture width center to edge may be utilized to compensate for radiation dwell or residency time. In embodiments with apertures approximate a sector, the angle measure of the sector may be between about 0.01° and about 20°. Generally, the power density of the laser radiation from center to edge may be constant, linearly increasing, or exponentially increasing, or combinations thereof.

Figure 5A:
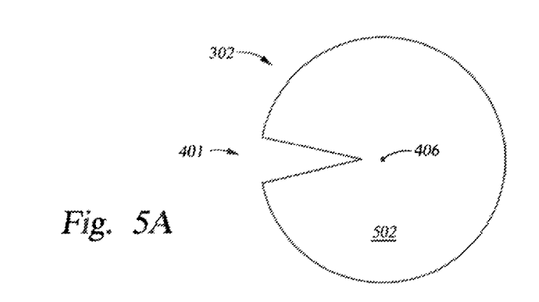
FIGS. 5A-5E illustrate schematic, plan views of various reflector plates according to various embodiments described herein.

FIG. 5A illustrates the reflector plate 302 having a body 502 defining the aperture 401. In this embodiment, the aperture 401 approximates a sector, however, the origin of the sector is offset from the center 406 of the reflector plate 302. It is contemplated that the dwell time of laser radiation from the radiation module 201 for a rotating substrate at the center of the substrate is infinitely high. To account for potential problems with overheating the center of the substrate, the aperture 401 may be offset from the center 406 of the reflector plate 302. It is believed that the center of the substrate may receive adequate exposure to laser radiation via lateral thermal diffusion, assuming the aperture extends a distance slightly less than the radius of the reflector plate 302 so that the center of the substrate avoids direct exposure to laser radiation. In addition, power densities of the laser along the radius of the substrate through the aperture 401 may be modulated by the laser power, the aperture shape, and/or the optics used to modify the laser radiation prior to reaching the substrate to generate a uniform annealing profile from the substrate center to edge.

Figure 5B:
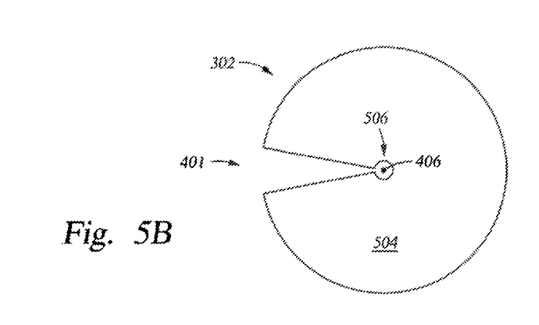

FIG. 5B illustrates the reflector plate 302 having a body 504 defining the aperture 401. In this embodiment, the aperture 401 approximates a sector similar to the aperture 401 described with regard to FIG. 5A with the central offset, but the aperture 401 extends around the center 406 of the reflector plate 302 to form a substantially circular aperture 506 adjacent the aperture 401. In this embodiment, the power density of the laser radiation from center to edge along the substrate may be modulated so the center region of the substrate exposed by the circular aperture 506 received continuous exposure but at a lesser density when compared to other regions along the radius towards the edge of the reflector plate 302. In this embodiment, the power density may be contoured to increase from the center of the substrate to the circumference of the substrate.

Figure 5C:
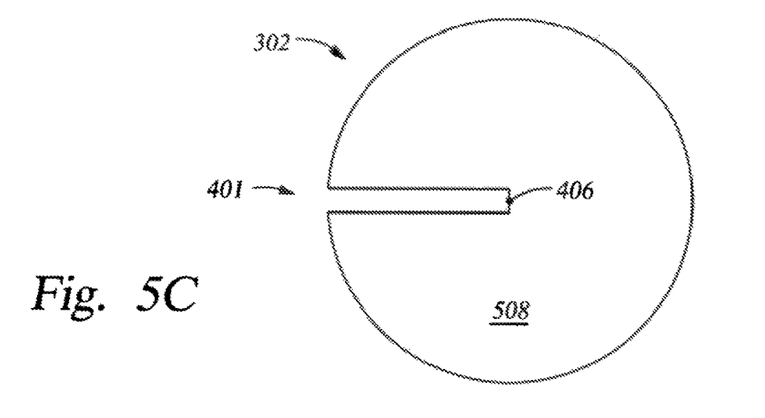

FIG. 5C illustrates the reflector plate 302 having a body 508 defining the aperture 401. In this embodiment, the aperture 401 is substantially ribbon-like or rectangular in shape. The aperture 401 may extend from the center of the reflector plate 302 to the circumference of the reflector plate. In this embodiment, the power density of the laser radiation may be a contoured power density which increases substantially linearly from the center of a substrate to the edge of a substrate. Here, the power contouring may account for dwell time differences between regions of the substrate near the center and the edge instead of using the aperture's exposure area to compensate for dwell time differences.

Figure 5D:
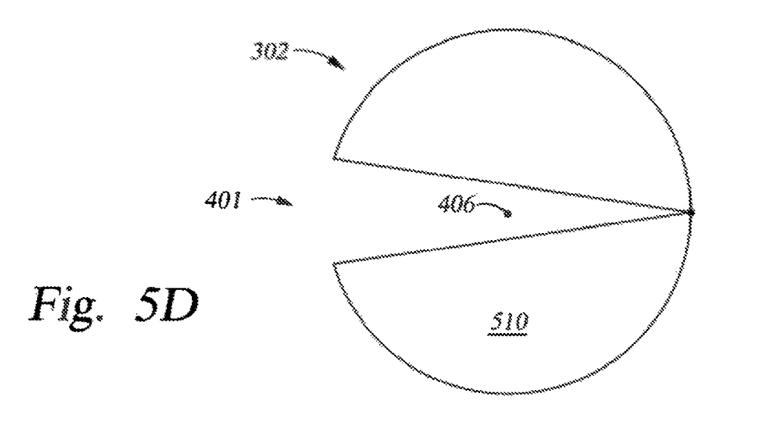

FIG. 5D illustrates the reflector plate 302 having a body 510 defining the aperture 401. The body 510 may be a single discoid structure or may be two individual plates joined at one point on the circumference of the defined by the two plates. In another embodiment, the body 510 may be two half-circular plates defining the aperture 401 which may extend along the diameter of the reflector plate. In this embodiment, assuming a constant power density of the laser radiation across the radius or diameter of the substrate, the dwell time will be at maxima and minima approximately 180° apart during rotation of the substrate. Alternatively, the power density may be contoured to increase from the center of the substrate to the edge of the substrate because the center of the substrate would likely experience a constant exposure to laser radiation.

Figure 5E:
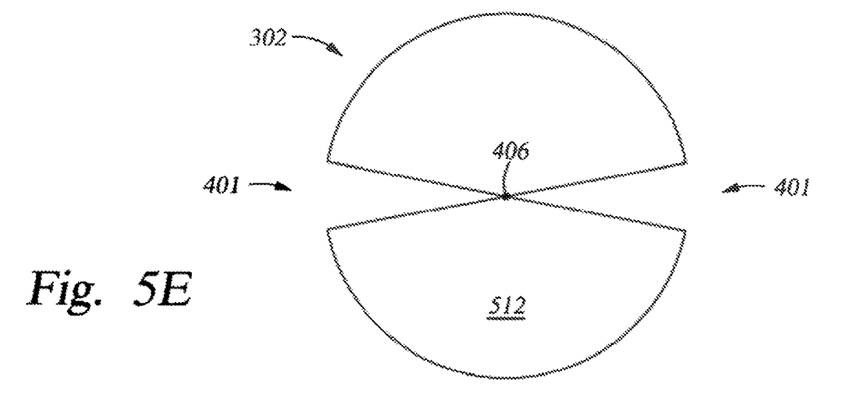

FIG. 5E illustrates the reflector plate 302 having a body 512 defining the aperture 401. In this embodiment, the aperture 401 is a dual aperture. A first aperture approximating a sector may extend from the center of the reflector plate 302 and a second aperture approximating a sector may extend from the center of the reflector plate 302 opposite the first aperture. The body 512 may be a single discoid structure. Alternatively, two plate-like structure may be joined at the center 406 of the reflector plate 302 with dimensions configured to define the apertures 401. The power density of the laser radiation propagating through the aperture may be substantially constant center to edge given the progressive increase of the apertures 401 from the center 406 of the reflector plate to the circumference.

In the embodiments described above, a region of a substrate would receive two exposures to the laser radiation over one full rotation of the substrate. Thus, multiple flash anneals may be achieved per substrate rotation. Also, it is contemplated that three apertures, four apertures, or five or more apertures may be utilized to increase the frequency of radiation exposure during a single substrate rotation. It is believed the increasing the frequency of flash anneals during a flash on spike rapid thermal process may be beneficial for uniformity purposes without causing substrate deformation as a result of the low thermal diffusion, shallow penetration, and quick dissipation of radiation is such regimes.

Figure 6A:
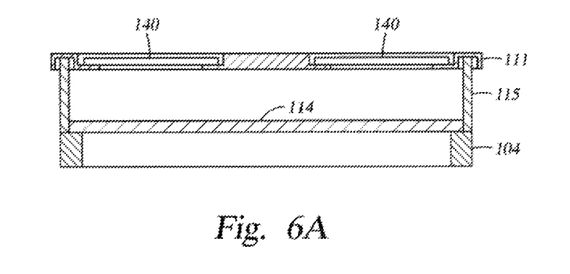
FIG. 6A illustrates a schematic, cross-sectional view of a batch substrate support according to embodiments described herein.

FIG. 6A illustrates a schematic, cross-sectional view of a batch substrate support 600 according to embodiments described herein. The batch substrate support 600 may include the annular ring 111 which is adapted to carry two or more substrates 140 during a rotational rapid thermal process. The batch substrate support 600 may be utilized in the chambers 100, 300 described herein to thermally process multiple substrates 140 at the same time. The substrates 140 may be 200 mm substrate, 300 mm substrates, or smaller substrates, such as 4 inch substrates.

Figure 6B:
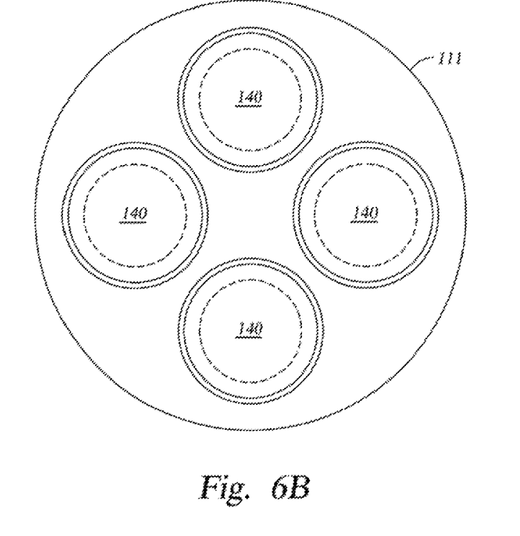
FIG. 6B illustrates a schematic, plan view of the batch substrate support of FIG. 6A according to embodiments described herein.

FIG. 6B illustrates a schematic, plan view of the batch substrate support 600 of FIG. 6A according to embodiments described herein. As illustrated, the annular ring 111 is configured to support a plurality of substrates 140 in positions discrete from one another. In one embodiment, the annular ring is disc-shaped. Although four substrates 140 are illustrated, it is contemplated that a greater or lesser number of substrates 140 may be supported by the annular ring 111. The substrates 140 may be exposed to laser radiation in a processing chamber, such as the chamber 300, and the reflector plate 302 may be configured with one or more apertures 401 to improve radiation exposure uniformity during flash anneal processes.

In summation, embodiments described herein relate to apparatus for flash on spike annealing processes. Laser radiation power and dwell time variables may be modulated by reflector plates with various aperture designs configured to compensate for center to edge exposure dwell time differences which may cause non-uniform heating profiles during annealing. Moreover, utilizing a combination of radiative heating and laser heating with a reflector plate having one or more apertures may provide for improved flash annealing processes with improved heat dissipation times and increased temperatures. The embodiments described herein may also be utilized in substrate processing operations where there is a temperature difference between two or more process operations. For example, deposition processes, deposition and treatment (i.e. doping) processes, and deposition and etch-back processes may find utility in modulating the temperature of the substrate during each operation of the process according to the embodiments described herein. Thus, embodiments described herein are contemplated to provide utility in flash on spike anneal processes and other substrate processing operations beyond annealing applications.

While the foregoing is directed to embodiments of the present disclosure, other and further embodiments of the disclosure may be devised without departing from the basic scope thereof, and the scope thereof is determined by the claims that follow.

What is claimed is:

1. An apparatus for processing a substrate, comprising:
a chamber defining an interior volume;
a radiation source disposed within the interior volume;
a rotatable support disposed within the interior volume adjacent the radiation source;
a laser source disposed within the interior volume adjacent the substrate support; and
a window disposed within the interior volume between the radiation source and the laser source.

2. The apparatus of claim 1, wherein the laser source comprises one or more of a continuous wave laser source, a pulsed laser source, a fiber laser source, and combinations thereof, and wherein the laser source is coupled to a translation mechanism.

3. The apparatus of claim 1, wherein radiation emitted from the laser source approximates a radius of a substrate being processed in the chamber.

4. The apparatus of claim 1, wherein radiation emitted from the laser source approximates a sector of a substrate.

5. The apparatus of claim 1, wherein radiation emitted from the laser source has a contoured power density which increases from a central area of a substrate to a circumference of the substrate.

6. The apparatus of claim 4, wherein the radiation emitted from the laser source has a contoured power density which increases from an origin of the sector to an arc defined by the sector.

7. An apparatus for processing a substrate, comprising:
a chamber defining an interior volume;
a radiation source disposed within the interior volume;
a rotatable substrate support disposed within the interior volume adjacent the radiation source;
a laser source disposed within the interior volume adjacent the substrate support; and
a reflector plate disposed within the interior volume between the laser source and the substrate support, wherein the reflector plate has one or more apertures formed therein.

8. The apparatus of claim 7, wherein the reflector plate is substantially circular.

9. The apparatus of claim 8, wherein the one or more apertures approximate a sector of the reflector plate.

10. The apparatus of claim 9, wherein in angle measure of the sector is between about 0.01° and about 20°.

11. The apparatus of claim 7, wherein the laser source comprises one or more of a continuous wave laser source, a pulsed laser source, a fiber laser source, and combinations thereof.

12. The apparatus of claim 7, wherein the laser source is positioned adjacent the one or more apertures such that a beam emitted from the laser source propagates through the one or more apertures.

13. The apparatus of claim 12, wherein the laser beam emitted from the laser source approximates a radius of the reflector plate.

14. The apparatus of claim 12, wherein the laser beam has a contoured power density which increases from a central area of the reflector plate to a circumference of the reflector plate.

15. The apparatus of claim 7, wherein the reflector plate is formed from a material opaque to a wavelength of radiation emitted from the laser source.

16. An apparatus for processing a substrate, comprising:
a chamber defining an interior volume;
a lamp radiation source disposed within the interior volume;
a rotatable substrate support disposed within the interior volume adjacent the lamp radiation source, the rotatable substrate support is an annular ring having discrete substrate support positions;
a laser source disposed within the interior volume adjacent the substrate support;
a window disposed within the interior volume between the lamp radiation source and the laser source; and
a circular reflector plate disposed within the interior volume between the laser source and the window, wherein the circular reflector plate has one or more sector shaped apertures formed therein.

17. The apparatus of claim 16, wherein in angle measure of the sector shaped apertures is between about 0.01° and about 20°.

18. The apparatus of claim 16, wherein the laser source comprises one or more of a continuous wave laser source, a pulsed laser source, a fiber laser source, and combinations thereof.

19. The apparatus of claim 16, wherein the laser source is positioned adjacent the one or more sector shaped apertures such that a beam emitted from the laser source propagates through the one or more sector shaped apertures.

20. The apparatus of claim 19, wherein the beam emitted from the laser source approximates the one or more sector shaped apertures.

* * * * *